US012670939B2

(12) United States Patent
Kavala et al.

(10) Patent No.: US 12,670,939 B2
(45) Date of Patent: Jun. 30, 2026

(54) MEMORY SYSTEM, OPERATING METHOD OF THE MEMORY SYSTEM, AND INTERFACE CIRCUIT OF THE MEMORY SYSTEM

(71) Applicant: Samsung Electronics Co., Ltd., Suwon-si (KR)

(72) Inventors: Anil Kavala, Suwon-si (KR); Youngmin Jo, Suwon-si (KR); Jungjune Park, Suwon-si (KR); Chiweon Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 125 days.

(21) Appl. No.: 18/426,825

(22) Filed: Jan. 30, 2024

(65) Prior Publication Data

US 2024/0257850 A1     Aug. 1, 2024

(30) Foreign Application Priority Data

Feb. 1, 2023    (KR) ......................... 10-2023-0013881
Apr. 26, 2023    (KR) ......................... 10-2023-0054969

(51) Int. Cl.
*G11C 7/22*        (2006.01)
*G11C 7/10*        (2006.01)

(52) U.S. Cl.
CPC ............ *G11C 7/225* (2013.01); *G11C 7/1096* (2013.01); *G11C 7/222* (2013.01)

(58) Field of Classification Search
CPC ....... G11C 7/225; G11C 7/1096; G11C 7/222; G11C 7/1093
See application file for complete search history.

(56) References Cited

U.S. PATENT DOCUMENTS

| | | | | |
|---|---|---|---|---|
| 6,466,491 | B2 * | 10/2002 | Yanagawa | ........... G06F 13/1689 |
| | | | | 365/194 |
| 7,821,311 | B2 | 10/2010 | Kim et al. | |
| 10,491,223 | B2 | 11/2019 | Jung et al. | |

(Continued)

FOREIGN PATENT DOCUMENTS

| | | | |
|---|---|---|---|
| KR | 20090076489 A | 7/2009 | |
| KR | 20100041197 A | 4/2010 | |

(Continued)

*Primary Examiner* — Jay W. Radke

(74) *Attorney, Agent, or Firm* — Wolf, Greenfield & Sacks, P.C.

(57) ABSTRACT

Provided is a memory system including a memory device including a plurality of non-volatile memories, each of the plurality of non-volatile memories being electrically connected to a buffer chip, and a memory controller electrically connected to the buffer chip and configured to transmit a reference clock signal used in correction of a data signal, wherein the buffer chip includes a delay clock generation chain configured to generate a first delay clock signal or a second delay clock signal from the reference clock signal, a first register configured to store the first delay clock signal, and a second register configured to store the second delay clock signal, and wherein the buffer chip is configured to perform compensation on a strobe signal of the data signal based on the first delay clock signal, and perform compensation on the data signal based on the second delay clock signal.

20 Claims, 17 Drawing Sheets

(56)                References Cited

U.S. PATENT DOCUMENTS

| | | | | |
|---|---|---|---|---|
| 10,680,593 | B2 | 6/2020 | Kim et al. | |
| 11,392,324 | B2 | 7/2022 | Na et al. | |
| 11,392,327 | B2 | 7/2022 | Balakrishnan et al. | |
| 11,522,550 | B2 | 12/2022 | Kavala et al. | |
| 2003/0219088 | A1* | 11/2003 | Kwak | H03L 7/0816 |
| | | | | 375/376 |
| 2014/0247683 | A1 | 9/2014 | Riho | |
| 2015/0091624 | A1 | 4/2015 | Kwak | |
| 2015/0311907 | A1* | 10/2015 | Wu | H03L 7/0814 |
| | | | | 327/158 |
| 2020/0201705 | A1* | 6/2020 | Kim | G11C 7/1093 |
| 2022/0044741 | A1* | 2/2022 | Kim | G11C 29/028 |

FOREIGN PATENT DOCUMENTS

| | | | |
|---|---|---|---|
| KR | 20190068033 | A | 6/2019 |
| KR | 20190068301 | A | 6/2019 |
| KR | 20210126821 | A | 10/2021 |
| KR | 20220108949 | A | 8/2022 |

* cited by examiner

1st Delay CLK

2nd Delay CLK

Fine Lock Resolution ($\tau_{F1} = \tau_{SLOW1} - \tau_{FAST1}$)

1st Delay CLK

2nd Delay CLK

Fine Lock Resolution $(\tau_{F2} = \tau_{SLOW2} - \tau_{FAST2})$

Fine Lock Resolution ($\tau_{F3} = \tau_{SLOW3} - \tau_{FAST3}$)

1$^{st}$ Delay CLK

2$^{nd}$ Delay CLK

Fine Lock Resolution ($\tau_{F4} = \tau_{SLOW4} - \tau_{FAST4}$)

$1^{st}$ Delay CLK $2^{nd}$ Delay CLK

Fine Lock Resolution ($\tau_{F5} = \tau_{SLOW5} - \tau_{FAST5}$)
360° Lock Done

MEMORY SYSTEM, OPERATING METHOD OF THE MEMORY SYSTEM, AND INTERFACE CIRCUIT OF THE MEMORY SYSTEM

CROSS-REFERENCE TO RELATED APPLICATIONS

This application is based on and claims priority under 35 U.S.C. § 119 to Korean Patent Application Nos. 10-2023-0013881, filed on Feb. 1, 2023, and 10-2023-0054969, filed on Apr. 26, 2023, in the Korean Intellectual Property Office, the disclosures of which are incorporated by reference herein in their entirety.

BACKGROUND

The inventive concepts relate to a memory system, an operating method of the memory system, and an interface circuit of the memory system, and more particularly, to a memory system using a buffer chip as an interface circuit between a host and a memory device.

Recently developed memory devices operate according to various specifications, and non-volatile memories can be implemented having a three-dimensional (3D) structure.

Recently developed memory devices can have the form of 3D memory devices. As the number of stacked layers of a 3D memory cell array increases, clocks for transmitting data vary for each memory cell of a memory device.

Although an optimized data clock duty exists for each memory cell, when data is transmitted by uniform data clocks in a two-dimensional memory device, a large amount of time and money can be consumed in performing a compensation operation on a data clock.

SUMMARY

The inventive concepts provide a clock signal on which duty correction is performed, and the duty correction is optimized for any one memory cell among a plurality of memory cells.

According to aspects of the inventive concepts, there is provided a memory system including a memory device including a plurality of non-volatile memories, each of the plurality of non-volatile memories being electrically connected to a buffer chip, and a memory controller electrically connected to the buffer chip and configured to transmit a reference clock signal used in correction of a data signal, wherein the buffer chip includes a delay clock generation chain configured to generate a first delay clock signal or a second delay clock signal from the reference clock signal, a first register configured to store the first delay clock signal, and a second register configured to store the second delay clock signal, and wherein the buffer chip is configured to perform compensation on a strobe signal of the data signal based on the first delay clock signal, and perform compensation on the data signal based on the second delay clock signal.

According to aspects of the inventive concepts, there is provided an operating method of a memory system including a memory device and a memory controller, the memory device including a plurality of non-volatile memories, each of the plurality of non-volatile memories being electrically connected to a buffer chip, and the memory controller being electrically connected to the buffer chip and configured to transmit a reference clock signal used in compensation of a data signal, the operating method including generating a first delay clock signal or a second delay clock signal from the reference clock signal, storing the first delay clock signal, storing the second delay clock signal, and compensating for the data signal based on the first delay clock signal and the second delay clock signal, wherein the compensating for the data signal includes performing compensation on a strobe signal of the data signal based on the first delay clock signal, and performing compensation on the data signal based on the second delay clock signal.

According to aspects of the inventive concepts, there is provided an interface circuit of a memory system, the interface circuit including a delay clock generation chain configured to generate a first delay clock signal or a second delay clock signal from a reference clock signal, a first register configured to store the first delay clock signal, and a second register configured to store the second delay clock signal, wherein the interface circuit is configured to perform compensation on a strobe signal of a data signal based on the first delay clock signal, and perform compensation on the data signal based on the second delay clock signal.

BRIEF DESCRIPTION OF THE DRAWINGS

Embodiments will be more clearly understood from the following detailed description taken in conjunction with the accompanying drawings in which:

FIGS. 2 and 3 are block diagrams each illustrating an interface circuit of a memory system according to some embodiments;

DETAILED DESCRIPTION

Terms used herein will be briefly described, and embodiments will be described in detail.

Figure 1:
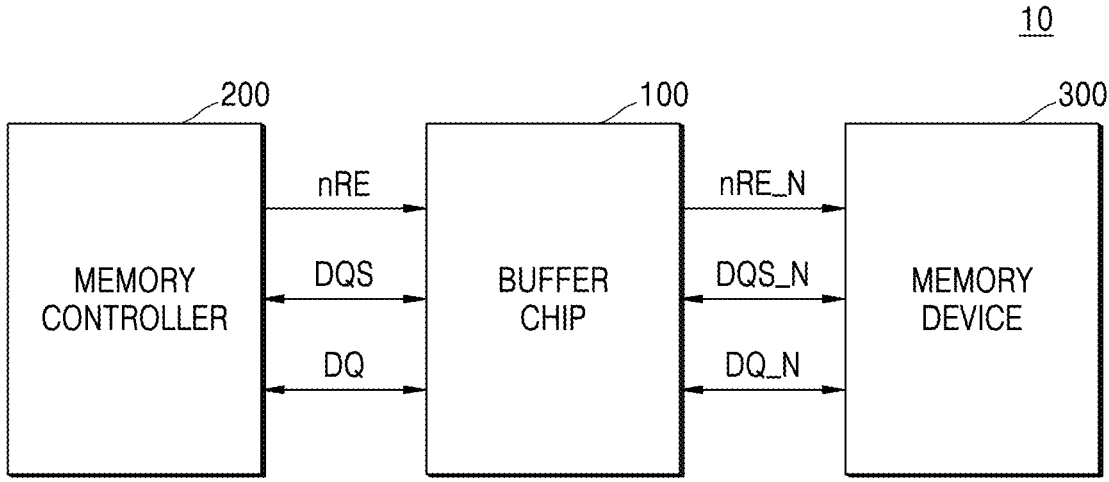
FIG. 1 is a block diagram of a memory system according to some embodiments.

FIG. 1 is a block diagram of a memory system 10 according to some embodiments.

Referring to FIG. 1, according to some embodiments, the memory system 10 may include a buffer chip 100, a memory controller 200, and/or a memory device 300.

According to some embodiments, the buffer chip 100 may be an interface circuit connecting the memory controller 200 and the memory device 300 to each other. According to some embodiments, the buffer chip 100 may receive a reference clock signal nRE, a strobe signal DQS for a data signal, and/or a data signal DQ from the memory controller 200. Also, according to some embodiments, the buffer chip 100 may transmit the strobe signal DQS for the data signal and/or the data signal DQ to the memory controller 200. Also, according to some embodiments, the buffer chip 100 may transmit a compensated reference clock signal nRE_N, a compensated strobe signal DQS_N, and/or a compensated data signal DQ_N to the memory device 300. Also, according to some embodiments, the buffer chip 100 may receive the compensated strobe signal DQS_N and/or the compensated data signal DQ_N from the memory device 300.

According to some embodiments, the buffer chip 100 may be an interface circuit in the memory system 10. According to some embodiments, while operating as an interface circuit, the buffer chip 100 may connect the memory controller 200 and the memory device 300 to each other, and may generate a first delay clock signal and/or a second delay clock signal from the reference clock signal nRE to perform compensation on the data signal DQ. According to some embodiments, the first delay clock signal may be a coarse delay signal of the reference clock signal nRE, and the second delay clock signal may be a Vernier delay signal of the reference clock signal nRE. According to some embodiments, the second delay clock signal may have a shorter duty cycle than the first delay clock signal, and may be suitable for fine correction of the data signal DQ or the strobe signal DQS. The specific configuration of the buffer chip 100 is described in detail with reference to FIGS. 2 and 3.

According to some embodiments, the memory controller 200 may be included in a host device (not shown) and may transmit a plurality of data signals DQ or strobe signals DQS to the memory device 300. Also, according to some embodiments, the memory controller 200 may transmit the reference clock signal nRE to the buffer chip 100. According to some embodiments, to perform a write or read operation on the memory device 300, the memory controller 200 may generate and transmit a plurality of command signals, to perform a write or read operation on the memory device 300.

According to some embodiments, the memory device 300 may include a plurality of non-volatile memories, and may be connected to the buffer chip 100 connected to each of the plurality of non-volatile memories. According to some embodiments, the memory device 300 may include a solid-state drive (SSD) device. However, the memory device 300 is not limited thereto, and may include a plurality of non-volatile memory devices or volatile memory devices. For example, the memory device 300 may include a non-volatile memory device, such as NAND flash memory, vertical NAND flash memory, NOR flash memory, resistive random-access memory (RAM) (RRAM), phase-change memory (PRAM), magnetoresistive RAM (MRAM), or the like. According to some embodiments, the memory device 300 may be implemented as a volatile memory, such as dynamic RAM (DRAM), mobile DRAM, and/or static RAM (SRAM), or as a non-volatile memory, such as PRAM, ferroelectric RAM (FRAM), RRAM, and/or MRAM.

Figure 2:
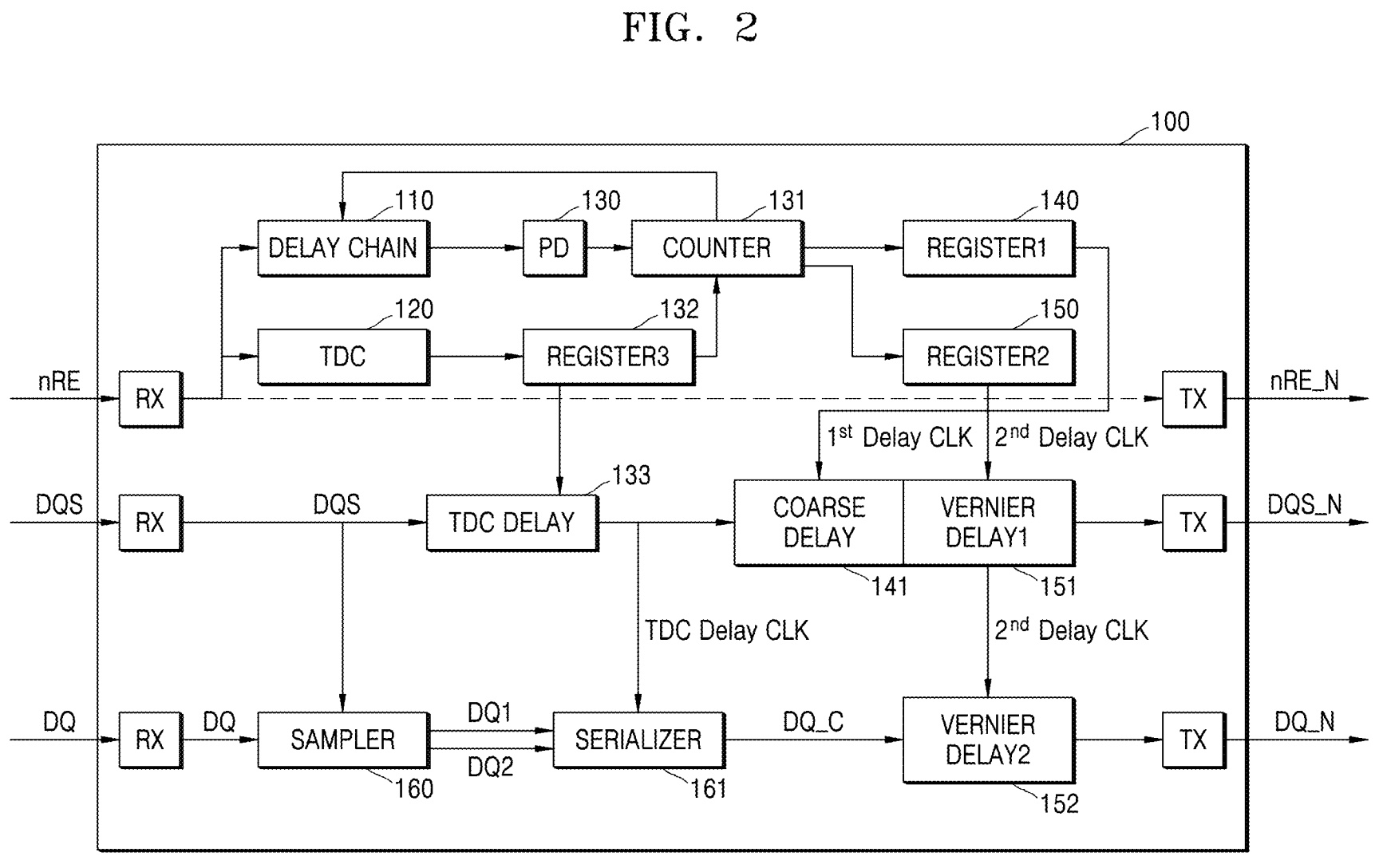
Figure 3:
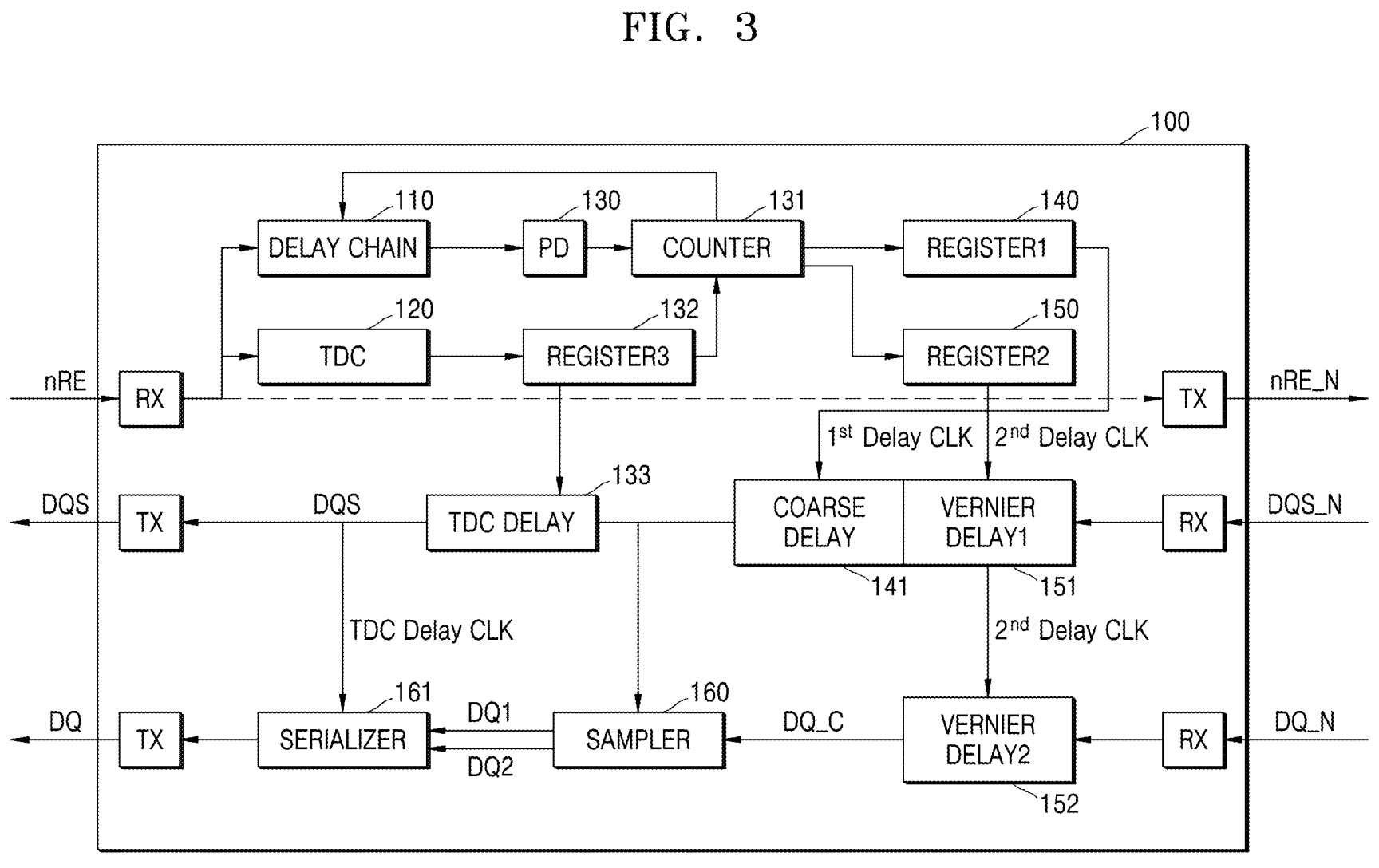

FIGS. 2 and 3 are block diagrams each illustrating the buffer chip 100 of the memory system 10 according to some embodiments. FIG. 2 illustrates the configuration of the buffer chip 100 when a write operation is performed in the memory system 10, according to some embodiments, and FIG. 3 illustrates the configuration of the buffer chip 100 when a read operation is performed in the memory system 10, according to some embodiments.

Referring to FIG. 2, according to some embodiments, the buffer chip 100 may include a delay clock generation chain 110, a time-to-digital converter (TDC) 120, a phase detector (PD) 130, a first register 140, a second register 150, and a sampler 160. Also, according to some embodiments, the buffer chip 100 may include a plurality of receiving terminals RX and/or transmitting terminals TX.

According to some embodiments, the delay clock generation chain 110 may generate a first delay clock signal and/or a second delay clock signal from the reference clock signal nRE. According to some embodiments, the reference clock signal nRE may be a data read signal. According to some embodiments, the first delay clock signal may be a coarse delay signal of the reference clock signal nRE, and the second delay clock signal may be a Vernier delay signal of the reference clock signal nRE. According to some embodiments, the second delay clock signal may have a shorter duty cycle than the first delay clock signal, and may be suitable for fine correction of the data signal DQ or the strobe signal DQS.

According to some embodiments, the TDC 120 may perform time-to-digital conversion on the reference clock signal nRE. According to some embodiments, the TDC 120 may generate a code for the reference clock signal nRE by performing time-to-digital conversion on the reference clock signal nRE. According to some embodiments, the code for the reference clock signal nRE generated by the TDC 120 may be used to compensate for the data signal DQ. For example, the buffer chip 100 may compensate for a data clock by combining a time-to-digital converted reference clock with the data signal DQ.

According to some embodiments, the PD 130 may receive the first delay clock signal and the second delay clock signal, and may transmit the received first delay clock signal and the second delay clock signal to a counter 131. According to some embodiments, the counter 131 may count edge signal intervals of the first delay clock signal and the second delay clock signal. According to an embodiment, when the number of edge signal intervals is determined to be insufficient for compensating for the strobe signal DQS or the data signal DQ, the buffer chip 100 may be configured to transmit the first delay clock signal or the second delay clock signal to the delay clock generation chain 110. According to some embodiments, when the delay clock generation chain 110 receives the first delay clock signal or the second delay clock signal from the counter 131, the delay clock generation chain 110 may generate a first delay clock signal or a second delay clock signal again from the reference clock signal nRE.

According to some embodiments, a code TDC CODE for the reference clock signal nRE that is time-to-digital converted, generated by the TDC 120, may be stored in a third register 132, and may be used to compensate for the data signal DQ. For example, the third register 132 may store information of the time-to-digital converted reference clock TDC Delay CLK (i.e., may store information of the reference clock signal nRE that is time-to-digital converted). For example, according to some embodiments, the code TDC CODE for the reference clock signal nRE that is time-to-digital converted may be stored in the third register 132 and transmitted to a time-to-digital conversion delay unit 133, and the time-to-digital conversion delay unit 133 may generate a time-to-digital converted reference clock TDC Delay CLK. According to an embodiment, the time-to-digital converted reference clock TDC Delay CLK may be a clock generated by the code TDC CODE for the reference clock signal nRE that is time-to-digital converted.

According to an embodiment, the time-to-digital converted reference clock TDC Delay CLK may pass through a time-to-digital conversion delay unit 133 to be combined with the data signal DQ, and may compensate for the data signal DQ. According to some embodiments, the compensation of the data signal DQ by the time-to-digital converted reference clock TDC Delay CLK may be a first compensation for the data signal DQ. For example, according to some embodiments, the buffer chip 100 may perform a first compensation on the data signal DQ by using the time-to-digital converted reference clock TDC Delay CLK, and may perform a second compensation on the data signal DQ based on the first delay clock signal or the second delay clock signal. According to some embodiments, in the memory system 10, the buffer chip 100 may reduce a phase difference between the data signal DQ and the strobe signal DQS by performing the first compensation and the second compensation on the data signal DQ.

According to some embodiments, the first register 140 may store a first delay clock code $1^{st}$ Delay CLK CODE. According to some embodiments, the first delay clock code $1^{st}$ Delay CLK CODE may be stored in the first register 140 and used as a signal for compensating for the strobe signal DQS. For example, to perform compensation on the strobe signal DQS, the first register 140 may generate a 90° phase-shifted clock for the strobe signal DQS based on the first delay clock code $1^{st}$ Delay CLK CODE. That is, to perform compensation on the strobe signal DQS, the first register 140 may phase-shift the first delay clock signal $1^{st}$ Delay CLK by 90°.

For example, the first register 140 may store the first delay clock code $1^{st}$ Delay CLK CODE and transmit the same to a coarse delay unit 141. According to an embodiment, the coarse delay unit 141 may perform delay compensation on the strobe signal DQS based on the first delay clock code $1^{st}$ Delay CLK CODE. According to an embodiment, the first delay clock code $1^{st}$ Delay CLK CODE may be used to perform a coarse locking operation on the strobe signal DQS. According to an embodiment, the coarse locking operation may be an operation of specifying a delay portion in a preset division of the strobe signal DQS and storing information of the delay portion. According to an embodiment, the preset division may be a 90° phase-shifted signal for the strobe signal DQS, but is not limited thereto.

According to some embodiments, the second register 150 may store a second delay clock code $2^{nd}$ Delay CLK CODE. According to some embodiments, the second delay clock code $2^{nd}$ Delay CLK CODE may be used to generate a second delay clock signal. For example, According to an embodiment, the second register 150 may transmit the second delay clock code $2^{nd}$ Delay CLK CODE to a first Vernier delay unit 151. According to an embodiment, the first Vernier delay unit 151 may perform delay compensation on the strobe signal DQS based on the second delay clock code $2^{nd}$ Delay CLK CODE. For example, According to an embodiment, the second delay clock code $2^{nd}$ Delay CLK CODE may be used to perform a fine locking operation on the strobe signal DQS.

According to an embodiment, the fine locking operation may be an operation of specifying a delay portion in a preset division of the strobe signal DQS and storing information of the delay portion. According to an embodiment, the information stored in the fine locking operation may be finer than the portion of the strobe signal DQS stored in the coarse locking operation. That is, According to an embodiment, the buffer chip 100 may specify and compensate for a delay portion for the strobe signal DQS in each of the coarse delay unit 141 and the first Vernier delay unit 151, thereby performing accurate delay compensation on the strobe signal DQS.

According to an embodiment, a first delay clock signal $1^{st}$ Delay CLK may be combined with the strobe signal DQS to perform compensation on the strobe signal DQS. For example, according to some embodiments, when edges of the strobe signal DQS and the data signal DQ for which compensation has been performed do not match due to the first delay clock signal $1^{st}$ Delay CLK, the buffer chip 100 may combine the second delay clock signal $2^{nd}$ Delay CLK with the strobe signal DQS. According to some embodiments, the second delay clock signal $2^{nd}$ Delay CLK CODE may be combined with the strobe signal DQS in the first Vernier delay unit 151.

According to an embodiment, the first Vernier delay unit 151 may transmit the second delay clock code $2^{nd}$ Delay CLK CODE to a second Vernier delay unit 152. According to an embodiment, the second Vernier delay unit 152 may generate the second delay clock signal $2^{nd}$ Delay CLK based on the second delay clock code $2^{nd}$ Delay CLK CODE. According to an embodiment, the second delay clock signal $2^{nd}$ Delay CLK may be a delay portion of the data signal DQ. For example, the second Vernier delay unit 152 may perform a fine locking operation on the data signal DQ, and may use the data signal DQ that is locked as the second delay clock signal $2^{nd}$ Delay CLK.

According to some embodiments, the data signal DQ may be compensated for by being combined with the second delay clock signal $2^{nd}$ Delay CLK in the second Vernier delay unit 152. For example, the data signal DQ may be received by the buffer chip 100 through the receiving terminal RX, and may be deserialized by the sampler 160. According to some embodiments, when the frequency of the data signal DQ is about 4.8 GHz, the data signal DQ may be deserialized into a first data signal DQ1 and/or a second data signal DQ2 each having a frequency of about 2.4 GHz. According to some embodiments, a serializer 161 may serialize the first data signal DQ1 and the second data signal DQ2 that have been deserialized, and may generate a serialized data signal DQ_C. According to some embodiments, the serialized data signal DQ_C may cause a delay in the process of being serialized, and as a result of the delay, may lose edge consistency with the strobe signal DQS. According to some embodiments, the second delay clock signal $2^{nd}$ Delay CLK may be combined with the serialized data signal DQ_C in the second Vernier delay unit 152, thereby performing compensation on the data signal DQ.

According to some embodiments, when compensation for the strobe signal DQS and the data signal DQ is completed, the buffer chip 100 may store the compensated strobe signal DQS_N, the compensated data signal DQ_N, and the compensated reference clock signal nRE_N, which includes compensation information, in the memory device 300.

Referring to FIG. 3, according to some embodiments, when a read operation is performed in the memory system 10, the buffer chip 100 may generate the first delay clock signal $1^{st}$ Delay CLK based on the first delay clock code $1^{st}$ Delay CLK CODE, and may generate the second delay clock signal $2^{nd}$ Delay CLK based on the second delay clock code $2^{nd}$ Delay CLK CODE. According to an embodiment, the buffer chip 100 may perform compensation on the strobe signal DQS (e.g., the compensated strobe signal DQS_N) based on the first delay clock signal $1^{st}$ Delay CLK and the second delay clock signal $2^{nd}$ Delay CLK. For example, according to some embodiments, even when a read operation is performed, the first delay clock code $1^{st}$ Delay CLK CODE may be stored in the first register 140 and used as a code for compensating for the compensated strobe signal DQS_N (also referred to as a first read signal for the strobe signal) stored in the memory device 300. For example, according to an embodiment, the first register 140 may store the first delay clock code $1^{st}$ Delay CLK CODE, and may perform a locking operation on a read data strobe signal DQS_N.

For example, the first register 140 may store the first delay clock code $1^{st}$ Delay CLK CODE and transmit the same to the coarse delay unit 141. According to an embodiment, the coarse delay unit 141 may perform delay compensation on the read data strobe signal DQS_N based on the first delay clock code $1^{st}$ Delay CLK CODE. According to an embodiment, the first delay clock code $1^{st}$ Delay CLK CODE may be used to perform a coarse locking operation on the read data strobe signal DQS_N. According to an embodiment, the coarse locking operation may be an operation of specifying a delay portion in a preset division of the read data strobe signal DQS_N and storing information of the delay portion. According to an embodiment, the preset division may be a 90° phase-shifted signal for the read data strobe signal DQS_N, but is not limited thereto.

According to some embodiments, the second register 150 may store the second delay clock code $2^{nd}$ Delay CLK CODE. According to some embodiments, the second delay clock code $2^{nd}$ Delay CLK CODE may be a signal for performing a delay compensation operation on the read data strobe signal DQS_N received from the memory device 300. For example, according to some embodiments, when edges of the read data strobe signal DQS_N and a read data signal DQ_N do not match, the buffer chip 100 perform compensation on the read data strobe signal DQS_N.

According to an embodiment, the second register 150 may transmit the second delay clock code $2^{nd}$ Delay CLK CODE to the first Vernier delay unit 151. According to an embodiment, the first Vernier delay unit 151 may perform delay compensation on the read data strobe signal DQS_N based on the second delay clock code $2^{nd}$ Delay CLK CODE. For example, according to an embodiment, the second delay clock code $2^{nd}$ Delay CLK CODE may be used to perform a fine locking operation on the read data strobe signal DQS_N.

According to an embodiment, the fine locking operation may be an operation of specifying a delay portion in a preset division of the read data strobe signal DQS_N and storing the delay portion. According to an embodiment, the portion stored in the fine locking operation may be finer than the portion of the read data strobe signal DQS_N stored in the coarse locking operation. That is, according to an embodiment, the buffer chip 100 may specify and compensate for a delay portion for the strobe signal DQS in each of the coarse delay unit 141 and the first Vernier delay unit 151, thereby performing accurate delay compensation on the strobe signal DQS.

According to some embodiments, the read data signal DQ_N (also referred to as a second read signal for the data signal) received from the memory device 300 may be compensated for based on the second delay clock code $2^{nd}$ Delay CLK CODE in the second Vernier delay unit 152. According to an embodiment, the first Vernier delay unit 151 may transmit the second delay clock code $2^{nd}$ Delay CLK CODE to the second Vernier delay unit 152. According to an embodiment, the second Vernier delay unit 152 may generate the second delay clock signal $2^{nd}$ Delay CLK based on the second delay clock code $2^{nd}$ Delay CLK CODE. According to an embodiment, the second delay clock signal $2^{nd}$ Delay CLK may be a delay portion of the data signal DQ. For example, the second Vernier delay unit 152 may perform a fine locking operation on the data signal DQ, and may use the data signal DQ that is locked as the second delay clock signal $2^{nd}$ Delay CLK.

For example, the read data signal DQ_N may be received by the buffer chip 100 through the receiving terminal RX, and may be compensated for based on the second delay clock code $2^{nd}$ Delay CLK CODE in the second Vernier delay unit 152. According to some embodiments, the read data signal DQ_N may be combined with the second delay clock signal $2^{nd}$ Delay CLK generated based on the second delay clock code $2^{nd}$ Delay CLK CODE to generate the serialized data signal DQ_C, and may be deserialized into the first data signal DQ1 and the second data signal DQ2 by the sampler 160. According to some embodiments, the first data signal DQ1 and the second data signal DQ2 may be serialized in the serializer 161. According to some embodiments, when the first data signal DQ1 and the second data signal DQ2 each have a frequency of about 2.4 GHz, the first data signal DQ1 and the second data signal DQ2 may be serialized so that the data signal DQ has a frequency of about 4.8 GHZ.

Figure 4:
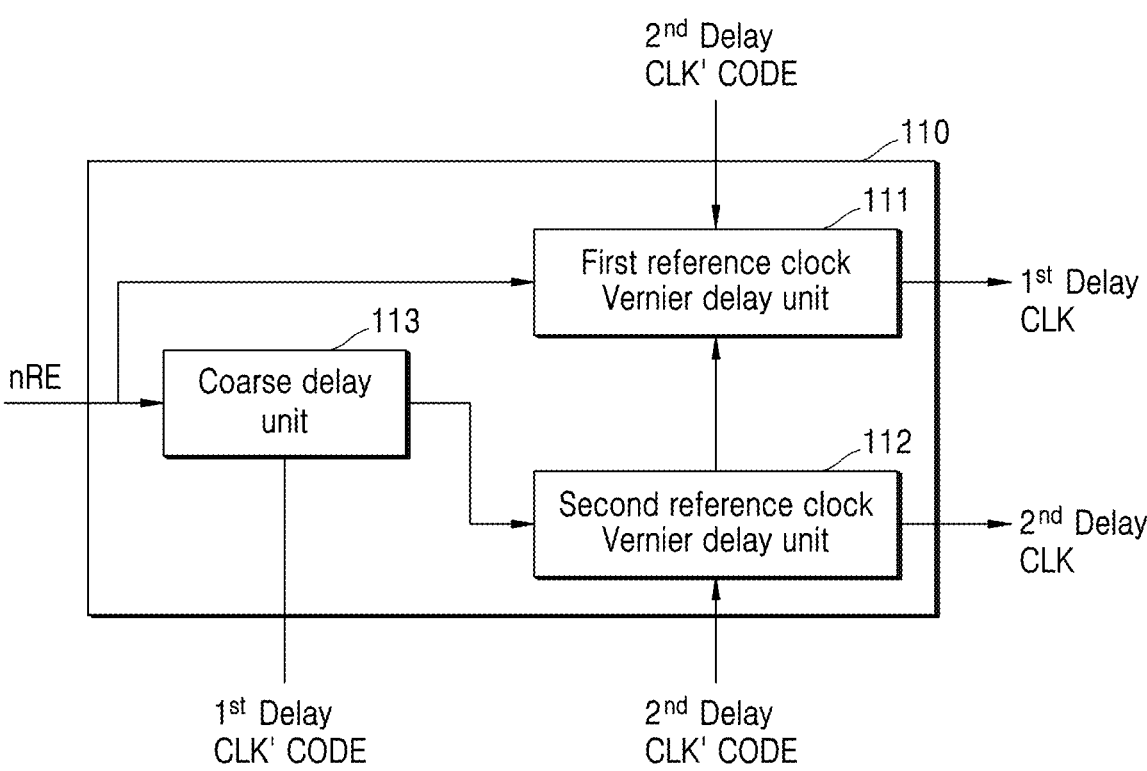
FIG. 4 is a block diagram illustrating a delay clock generation chain in a memory system according to some embodiments.

FIG. 4 is a block diagram illustrating the delay clock generation chain 110 in the memory system 10 according to some embodiments.

Referring to FIG. 4, according to some embodiments, the delay clock generation chain 110 may include a first reference clock Vernier delay unit 111, a second reference clock Vernier delay unit 112, and/or a coarse delay unit 113.

According to some embodiments, the first reference clock Vernier delay unit 111 may receive the reference clock signal nRE, and may generate the first delay clock signal $1^{st}$ Delay CLK. According to some embodiments, the first reference clock Vernier delay unit 111 may receive the reference clock signal nRE, and may generate the first delay clock signal $1^{st}$ Delay CLK based on the received reference clock signal nRE. For example, the first reference clock Vernier delay unit 111 may receive a second delay compensation clock code $2^{nd}$ Delay CLK' CODE, and may generate the first delay clock signal $1^{st}$ Delay CLK based on the received second delay compensation clock code $2^{nd}$ Delay CLK' CODE. According to an embodiment, the second delay compensation clock code $2^{nd}$ Delay CLK' CODE may include delay information for the strobe signal DQS.

According to an embodiment, the second reference clock Vernier delay unit 112 may receive the reference clock signal nRE, and may generate the second delay clock signal $2^{nd}$ Delay CLK based on the received reference clock signal nRE. For example, the second reference clock Vernier delay unit 112 may receive a second delay compensation clock code $2^{nd}$ Delay CLK' CODE, and may generate the second delay clock signal $2^{nd}$ Delay CLK based on the received second delay compensation clock code $2^{nd}$ Delay CLK' CODE. According to an embodiment, the second delay compensation clock code $2^{nd}$ Delay CLK' CODE may include delay information for the strobe signal DQS.

According to an embodiment, the coarse delay unit 113 may receive the reference clock signal nRE, and may generate a coarse delay clock signal. For example, the coarse delay unit 113 may receive the first delay compensation clock code $1^{st}$ Delay CLK' CODE, and may generate the coarse delay clock signal based on the reference clock signal nRE.

FIGS. 5A to 5F are timing diagrams illustrating a process of performing compensation on a data signal in a memory system, according to some embodiments.

Figure 5A:
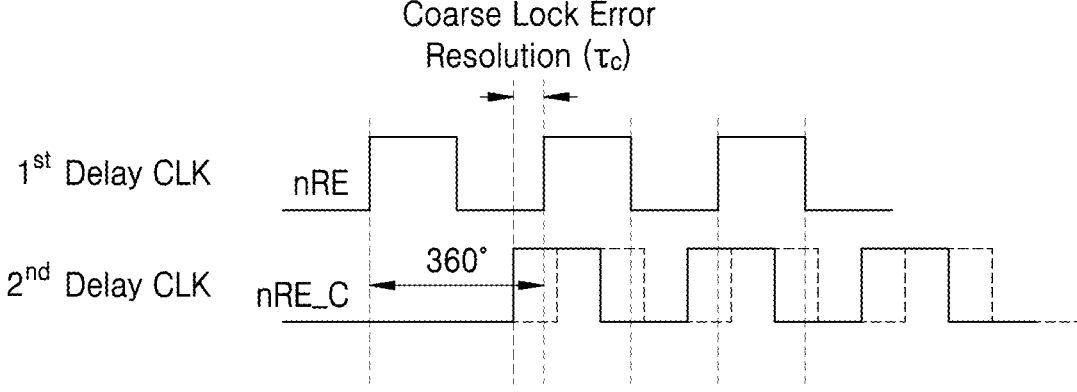
FIGS. 5A to 5F are timing diagrams illustrating a process of performing compensation on a data signal in a memory system, according to some embodiments.

FIG. 5A is a diagram illustrating a locking operation performed on a coarse delay clock signal in a memory system, according to an embodiment.

Referring to FIG. 5A, according to an embodiment, the first delay clock signal $1^{st}$ Delay CLK may be the reference clock signal nRE, and the second delay clock signal $2^{nd}$ Delay CLK may be a delay clock signal nRE_C for the reference clock signal nRE. For example, a phase difference between the second delay clock signal $2^{nd}$ Delay CLK and the first delay clock signal $1^{st}$ Delay CLK may be 360°. However, according to an embodiment, when the phase difference between the first delay clock signal $1^{st}$ Delay CLK and the second delay clock signal $2^{nd}$ Delay CLK does not exactly match 360°, the buffer chip 100 may perform a coarse locking operation on a delay portion of the second delay clock signal $2^{nd}$ Delay CLK, and may store a delay division (τc) of the second delay clock signal $2^{nd}$ Delay CLK that is locked. For example, delay division may be a delay step or delay offset value.

FIGS. 5B to 5F are diagrams illustrating a locking operation performed on a fine delay clock signal in a memory system, according to an embodiment.

Figure 5B:
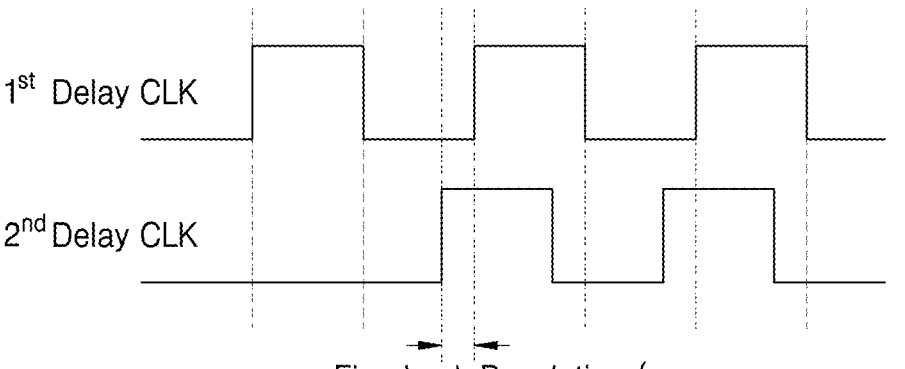
Figure 5C:
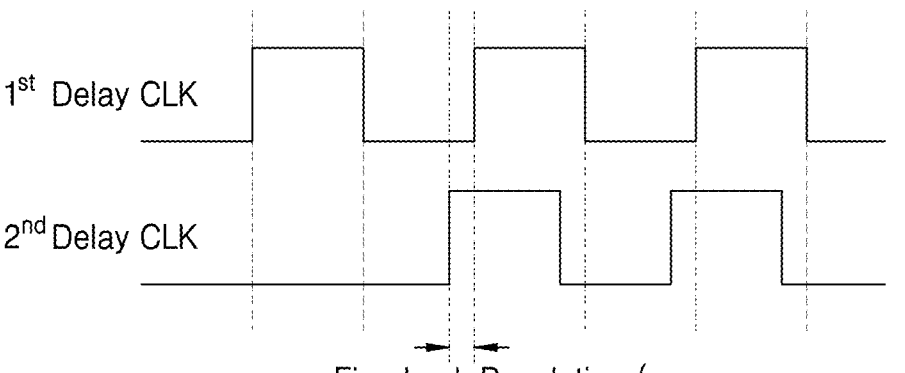
Figure 5D:
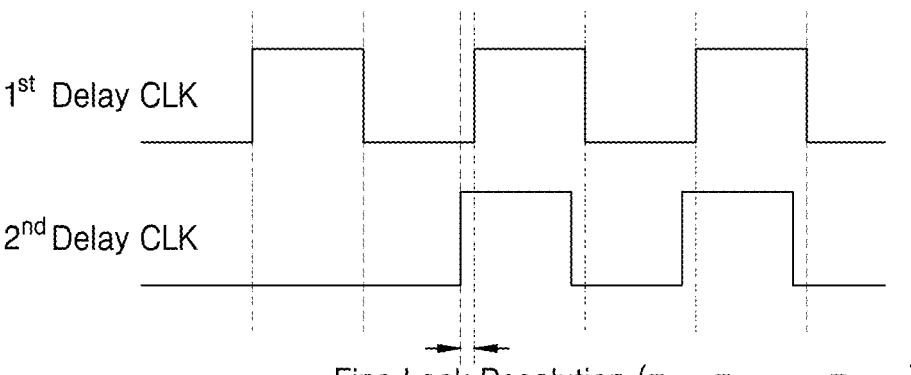
Figure 5E:
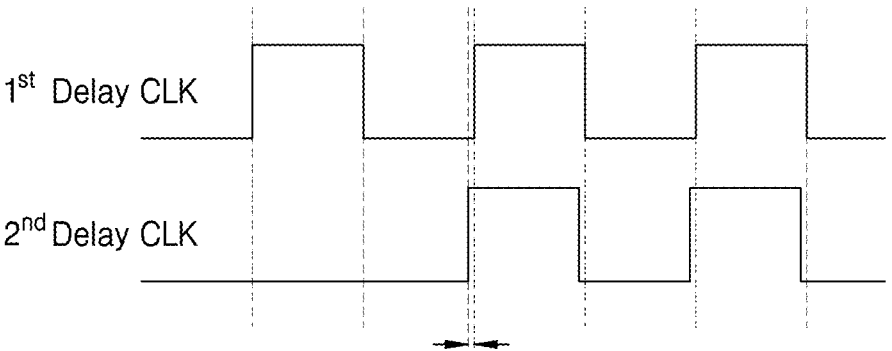

FIG. 5B is a timing diagram illustrating a locking operation for a fine delay clock signal in a first cycle of the first delay clock signal $1^{st}$ Delay CLK and the second delay clock signal $2^{nd}$ Delay CLK, according to an embodiment. FIG. 5C is a timing diagram illustrating a locking operation for a fine delay clock signal in a second cycle of the first delay clock signal $1^{st}$ Delay CLK and the second delay clock signal $2^{nd}$ Delay CLK, according to an embodiment. FIG. 5D is a timing diagram illustrating a locking operation for a fine delay clock signal in a third cycle of the first delay clock signal $1^{st}$ Delay CLK and the second delay clock signal $2^{nd}$ Delay CLK, according to an embodiment. FIG. 5E is a timing diagram illustrating a locking operation for a fine delay clock signal in a fourth cycle of the first delay clock signal $1^{st}$ Delay CLK and the second delay clock signal $2^{nd}$ Delay CLK, according to an embodiment.

Referring to FIGS. 5B to 5E, according to an embodiment, the buffer chip 100 may perform a fine locking operation on the first delay clock signal $1^{st}$ Delay CLK and the second delay clock signal $2^{nd}$ Delay CLK. For example, according to an embodiment, when the phase difference between the first delay clock signal $1^{st}$ Delay CLK and the second delay clock signal $2^{nd}$ Delay CLK does not exactly match 360°, as described with reference to FIG. 5A, the buffer chip 100 may perform a coarse locking operation on a delay portion of the second delay clock signal $2^{nd}$ Delay CLK, and may store a coarse delay division (τc) of the second delay clock signal $2^{nd}$ Delay CLK that is locked.

According to an embodiment, the buffer chip 100 may lock the phase difference between the first delay clock signal $1^{st}$ Delay CLK and the second delay clock signal $2^{nd}$ Delay CLK, and may perform correction to narrow the phase difference the first delay clock signal $1^{st}$ Delay CLK and the second delay clock signal $2^{nd}$ Delay CLK. For example, as the processes according to the embodiments from FIG. 5B to FIG. 5E proceed, the magnitude of a fine delay division (τFn) may decrease. According to an embodiment, the fine delay division (τFn) may be a division smaller than the coarse delay division. Also, the fine delay division (τFn) may be a value obtained by subtracting a fast delay division (τFAST) from a slow delay division (τSLOW). According to an embodiment, the slow delay division (τSLOW) may be a division generated based on the first reference clock Vernier delay unit 111, and the fast delay division (τFAST) may be a division generated by the coarse delay unit 113 and the second reference clock Vernier delay unit 112. According to an embodiment, the buffer chip 100 may perform a fine locking operation on the delay portion of the second delay clock signal $2^{nd}$ Delay CLK, and may store the fine delay division (τFn) of the second delay clock signal $2^{nd}$ Delay CLK that is locked.

Figure 5F:
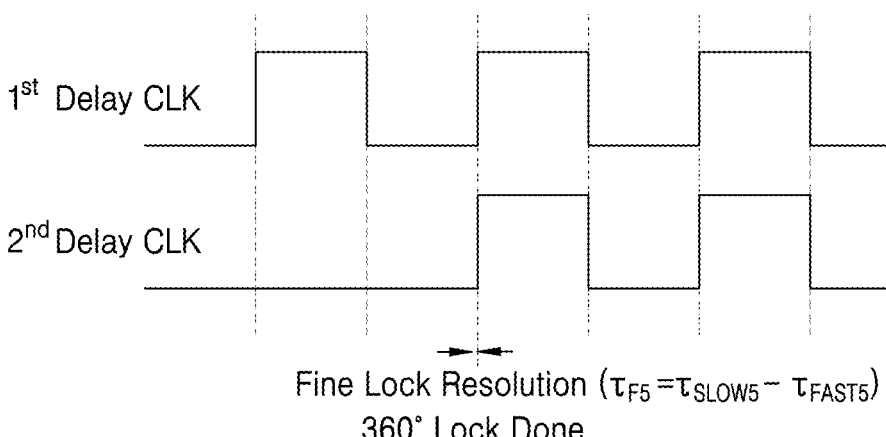

FIG. 5F is a timing diagram illustrating completion of a locking operation for a fine delay clock signal according to an embodiment.

Referring to FIG. 5F, according to an embodiment, when the locking operation for the fine delay clock signal is completed, the first delay clock signal $1^{st}$ Delay CLK and the second delay clock signal $2^{nd}$ Delay CLK may be aligned at rising and falling edges.

Figure 6:
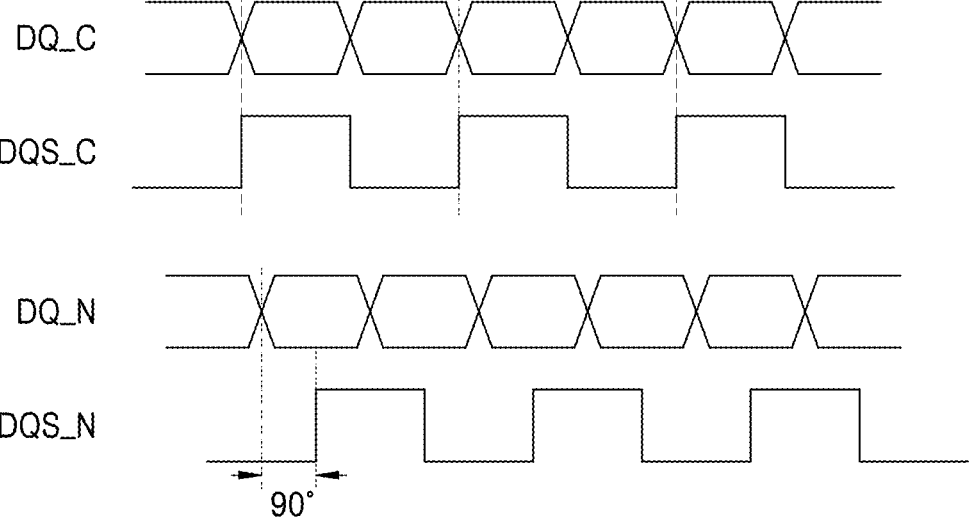
FIG. 6 is a timing diagram illustrating delays of a data signal and a data strobe signal according to an embodiment.

FIG. 6 is a timing diagram illustrating delays of a data signal and a data strobe signal according to an embodiment.

Referring to FIG. 6, according to an embodiment, no delay may occur between a write data signal clock DQ_C and a write data strobe signal clock DQS_C. However, according to an embodiment, a delay may occur between a read data signal clock DQ_N and a read data strobe signal clock DQS_N during a read process. According to an embodiment, the read data strobe signal clock DQS_N may be delayed with a phase difference of 90°. According to an embodiment, the delay of the read data strobe signal clock DQS_N may be corrected by the delay division described with reference to FIGS. 5A to 5F. For example, the buffer chip 100 may perform delay compensation by combining the delay division with the read data strobe signal clock DQS_N.

Figure 7:
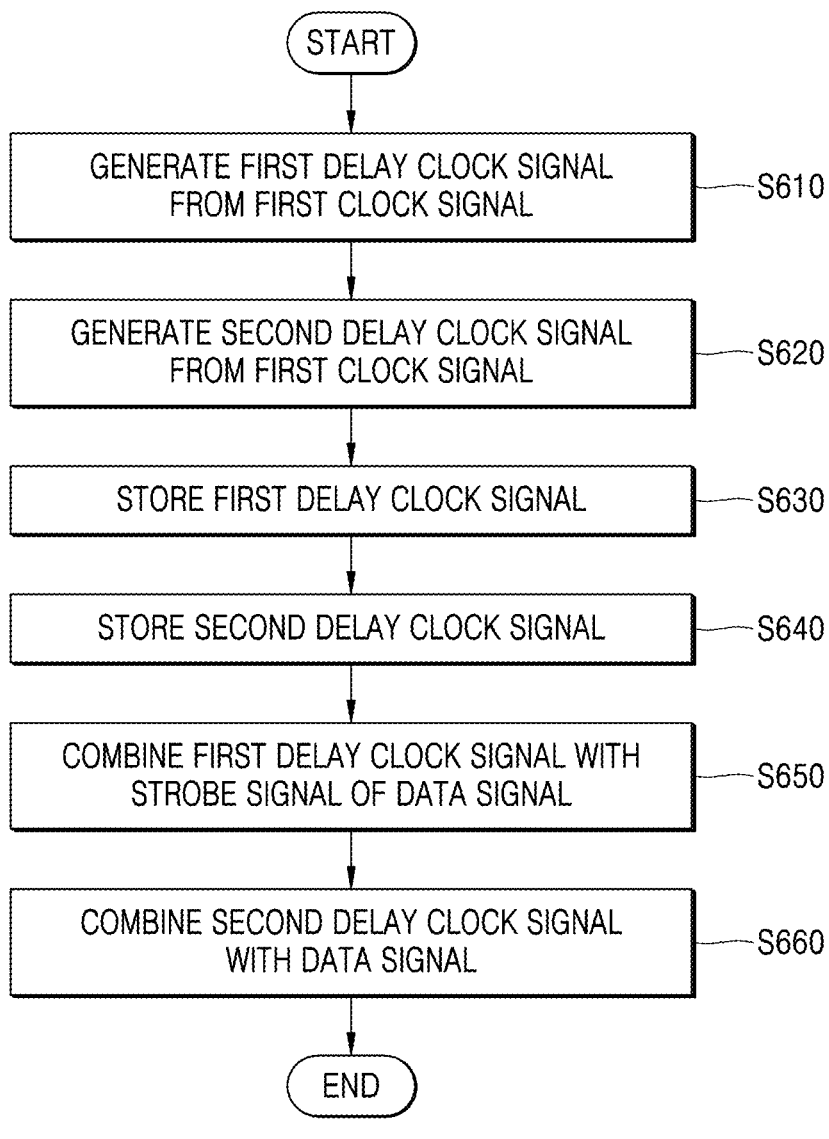
FIG. 7 is a flowchart of an operating method of a memory system according to some embodiments.

FIG. 7 is a flowchart of an operating method of the memory system 10 according to some embodiments.

Referring to FIG. 7, according to some embodiments, the memory system 10 may generate a first delay clock signal from a first clock signal (S610). According to some embodiments, the memory system 10 may generate a first delay clock signal from the reference clock signal nRE. According to some embodiments, the term "first clock signal" may refer to the reference clock signal nRE.

According to some embodiments, the memory system 10 may generate a second delay clock signal from the first clock signal (S620).

According to some embodiments, the memory system 10 may generate a second delay clock signal from the first clock signal, and as described above, the term "first clock signal" may refer to the reference clock signal nRE.

According to some embodiments, the first delay clock signal may be a coarse delay signal of the reference clock signal nRE, and the second delay clock signal may be a Vernier delay signal of the reference clock signal nRE. According to some embodiments, the second delay clock signal may have a shorter duty cycle than the first delay clock signal, and may be suitable for fine correction of the data signal DQ or the strobe signal DQS.

According to some embodiments, when the first delay clock signal is generated, the memory system 10 may store the first delay clock signal (S630).

According to some embodiments, the memory system 10 may store the first delay clock signal $1^{st}$ Delay CLK. According to some embodiments, the first delay clock signal $1^{st}$ Delay CLK may be stored in the first register 140 of the memory system 10 and used as a signal for compensating for the strobe signal DQS. For example, to perform compensation on the strobe signal DQS, the memory system 10 may generate a 90° phase-shifted clock for the first delay clock signal $1^{st}$ Delay CLK. That is, to perform compensation on the strobe signal DQS, the memory system 10 may phase-shift the first delay clock signal $1^{st}$ Delay CLK by 90°. For example, according to some embodiments, the memory system 10 may store the first delay clock signal $1^{st}$ Delay CLK that has been phase-shifted by 90°. According to some embodiments, the first delay clock signal $1^{st}$ Delay CLK that has been phase-shifted by 90° may be combined with the strobe signal DQS in the coarse delay unit 141, thereby performing compensation on the strobe signal DQS.

According to some embodiments, when the second delay clock signal is generated, the memory system 10 may store the second delay clock signal (S640).

For example, the second delay clock signal $2^{nd}$ Delay CLK may be stored in the second register 150 and used as a signal for compensating for the strobe signal DQS. According to some embodiments, the second delay clock signal $2^{nd}$ Delay CLK may be combined with the strobe signal DQS to perform compensation on the strobe signal DQS.

According to some embodiments, the memory system 10 may combine the first delay clock signal with the strobe signal DQS of a data signal (S650).

For example, compensation may be performed on the strobe signal DQS for a data signal by the first delay clock code $1^{st}$ Delay CLK CODE. According to some embodiments, the memory system 10 may generate the first delay clock signal based on the first delay clock code $1^{st}$ Delay CLK CODE, and may perform compensation by combining the first delay clock signal with the strobe signal DQS for the data signal.

According to some embodiments, the memory system 10 may combine the second delay clock signal with the data signal DQ (S660).

For example, according to some embodiments, when edges of the strobe signal DQS and the data signal DQ for which compensation has been performed do not match due to the first delay clock code $1^{st}$ Delay CLK CODE, the memory system 10 may generate the second delay clock signal based on the second delay clock code $2^{nd}$ Delay CLK CODE, and may perform compensation by combining the second delay clock signal with the strobe signal DQS.

Figure 8:
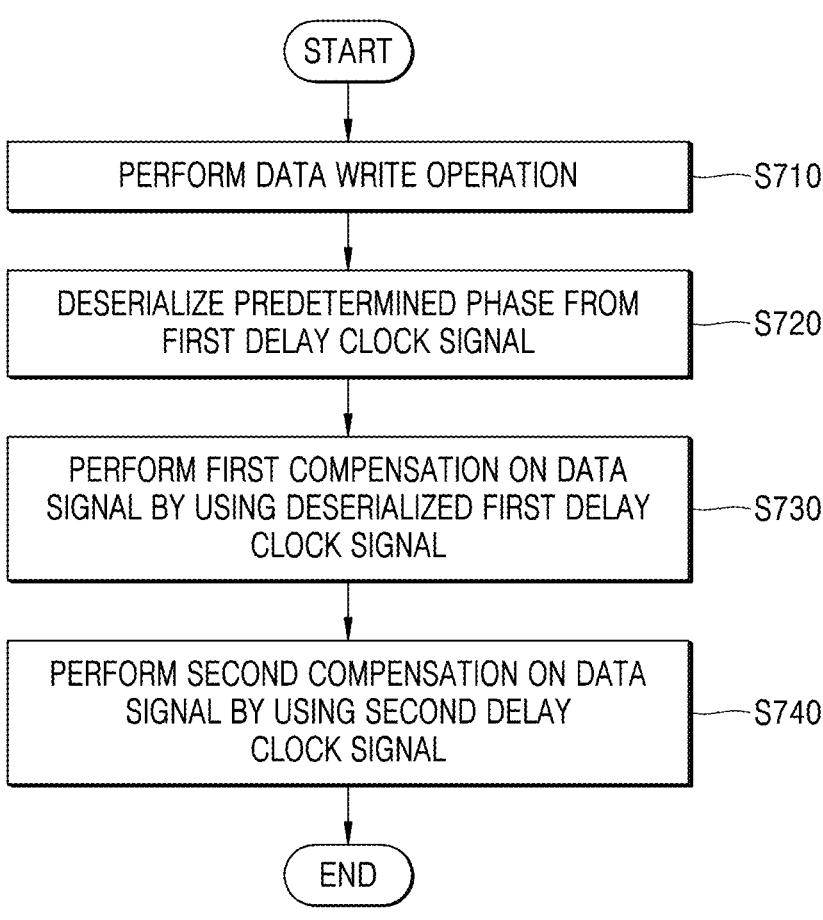
FIG. 8 is a flowchart illustrating a process of performing compensation on a data signal when a write operation is performed in an operating method of a memory system, according to some embodiments.

FIG. 8 is a flowchart illustrating a process of performing compensation on a data signal when a write operation is performed in the operating method of the memory system 10, according to some embodiments.

Referring to FIG. 8, according to some embodiments, the memory system 10 may perform a data write operation (S710).

According to some embodiments, in performing the data write operation, the memory system 10 may generate a first delay clock signal or a second delay clock signal from the reference clock signal nRE. According to some embodiments, the reference clock signal nRE may be a data read signal. According to some embodiments, the first delay clock signal may be a coarse delay signal of the reference clock signal nRE, and the second delay clock signal may be a Vernier delay signal of the reference clock signal nRE. According to some embodiments, the second delay clock signal may have a shorter duty cycle than the first delay clock signal, and may be suitable for fine correction of the data signal DQ or the strobe signal DQS.

According to some embodiments, in performing the data write operation, the memory system 10 may deserialize a predetermined phase from the first delay clock signal (S720).

For example, to perform compensation on the strobe signal DQS, the memory system 10 may generate a 90° phase-shifted clock for the first delay clock signal based on the first delay clock code $1^{st}$ Delay CLK CODE. That is, to perform compensation on the strobe signal DQS, the memory system 10 may phase-shift the first delay clock signal $1^{st}$ Delay CLK by 90°. For example, according to some embodiments, the memory system 10 may store the first delay clock signal $1^{st}$ Delay CLK that has been phase-shifted by 90°. According to some embodiments, the first delay clock signal $1^{st}$ Delay CLK that has been phase-shifted by 90° may be combined with the strobe signal DQS, thereby performing compensation on the strobe signal DQS.

According to some embodiments, when the predetermined phase is deserialized from the first delay clock signal, the memory system 10 may perform a first compensation on a data strobe signal by using the first delay clock signal and the second delay clock signal that have been deserialized (S730).

According to some embodiments, the second delay clock signal $2^{nd}$ Delay CLK may be combined with the strobe signal DQS to perform compensation on the strobe signal DQS. For example, according to some embodiments, when edges of the strobe signal DQS and the data signal DQ for which compensation has been performed do not match due to the first delay clock signal $1^{st}$ Delay CLK, the memory system 10 may combine the second delay clock signal $2^{nd}$ Delay CLK with the strobe signal DQS. According to some embodiments, the second delay clock signal $2^{nd}$ Delay CLK may be combined with the strobe signal DQS for the data signal. According to some embodiments, the first compensation may be compensation for the strobe signal DQS for the data signal.

According to some embodiments, when the predetermined phase is deserialized from the first delay clock signal, the memory system 10 may perform a second compensation on the data signal by using the second delay clock signal (S740).

According to some embodiments, the data signal DQ may be compensated by being combined with the second delay clock signal $2^{nd}$ Delay CLK. For example, the data signal DQ may be received by the buffer chip 100 through the receiving terminal RX, and may be deserialized by the sampler 160. According to some embodiments, when the frequency of the data signal DQ is about 4.8 GHz, the data signal DQ may be deserialized into the first data signal DQ1 and/or the second data signal DQ2 each having a frequency of about 2.4 GHz. According to some embodiments, the serializer 161 may serialize the first data signal DQ1 and the second data signal DQ2 that have been deserialized, and may generate the serialized data signal DQ_C. According to some embodiments, the serialized data signal DQ_C may cause a delay in the process of being serialized, and as a result of the delay, may lose edge consistency with the strobe signal DQS. According to some embodiments, the second delay clock signal $2^{nd}$ Delay CLK may be combined with the serialized data signal DQ_C, thereby performing compensation on the data signal DQ. According to some embodiments, the second compensation may be compensation for the data signal DQ.

Figure 9:
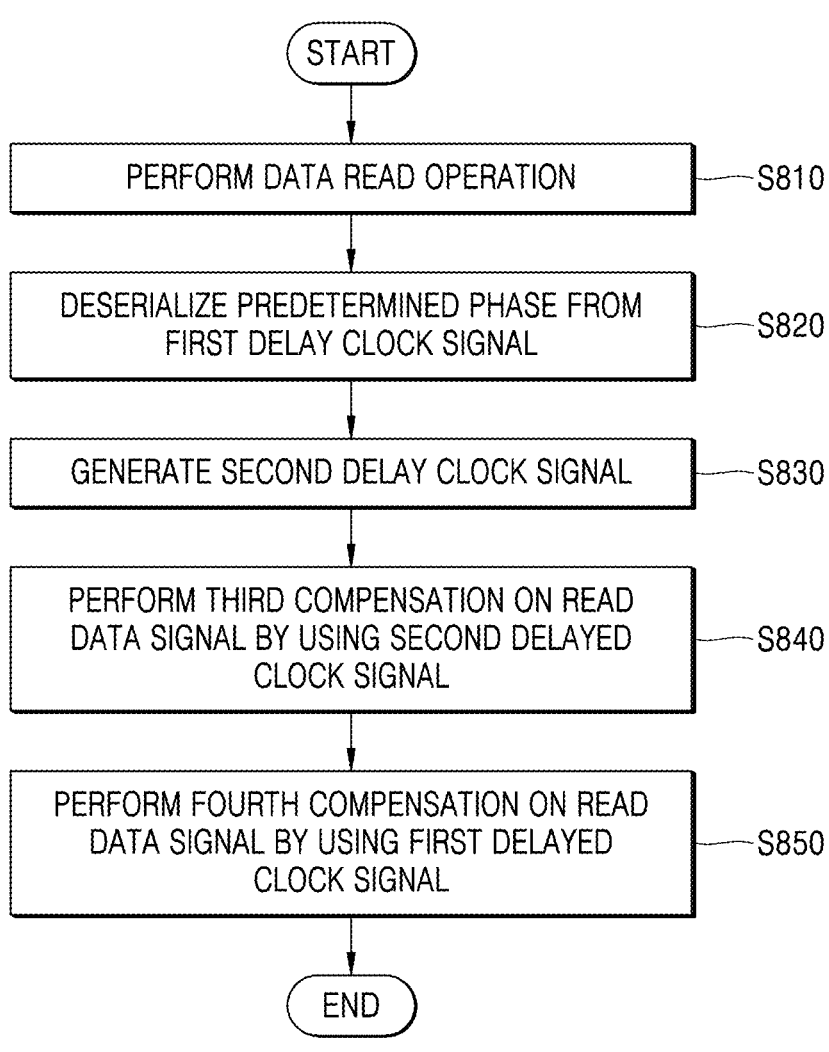
FIG. 9 is a flowchart illustrating a process of performing compensation on a data signal when a read operation is performed in an operating method of a memory system, according to some embodiments.

FIG. 9 is a flowchart illustrating a process of performing compensation on a data signal when a read operation is performed in the operating method of the memory system 10, according to some embodiments.

Referring to FIG. 9, according to some embodiments, the memory system 10 may perform a data read operation (S810).

According to some embodiments, in performing the data read operation, the memory system 10 may deserialize a predetermined phase from a first delay clock signal (S820).

For example, according to some embodiments, even when a read operation is performed, the first delay clock signal $1^{st}$ Delay CLK may be stored in the first register 140 and used as a signal for compensating for the read data strobe signal DQS_N stored in the memory device 300. For example, to perform compensation on the read data strobe signal DQS_N stored in the memory device 300, the first register 140 may generate a 90° phase-shifted clock for the first delay clock signal $1^{st}$ Delay CLK. That is, to perform compensation on the read data strobe signal DQS_N stored in the memory device 300, the first register 140 may phase-shift the first delay clock signal $1^{st}$ Delay CLK by 90°. For example, according to some embodiments, the first register 140 may store the first delay clock signal $1^{st}$ Delay CLK that has been phase-shifted by 90°. According to some embodiments, the first delay clock signal $1^{st}$ Delay CLK that has been phase-shifted by 90° may be coupled to (e.g., combined with) the read data strobe signal DQS_N stored in the memory device 300, in the coarse delay unit 141, thereby performing compensation on the read data strobe signal DQS_N stored in the memory device 300.

According to some embodiments, when the predetermined phase is deserialized from the first delay clock signal, the memory system 10 may generate a second delay clock signal (S830). According to some embodiments, when a read operation is performed in the memory system 10, the memory system 10 may combine the first delay clock signal $1^{st}$ Delay CLK with the second delay clock signal $2^{nd}$ Delay CLK, and perform compensation on the strobe signal DQS based on the first delay clock signal $1^{st}$ Delay CLK and the second delay clock signal $2^{nd}$ Delay CLK that are combined.

According to some embodiments, when the second delay clock signal is generated, a third compensation may be performed on a read data signal based on the second delay clock signal (S840).

According to some embodiments, the second delay clock signal $2^{nd}$ Delay CLK may be combined with the read data strobe signal DQS_N received from the memory system 10 to perform compensation on the read data strobe signal DQS_N received from the memory system 10. For example, according to some embodiments, when edges of the read data strobe signal DQS_N received from the memory device 300 and the read data signal DQ_N received from the memory device 300 do not match due to the first delay clock signal $1^{st}$ Delay CLK, the memory system 10 may combine the second delay clock signal $2^{nd}$ Delay CLK with the read data strobe signal DQS_N. According to some embodiments, the second delay clock signal $2^{nd}$ Delay CLK may be combined with the read data strobe signal DQS_N. According to some embodiments, the third compensation may refer to a compensation operation for a data strobe signal in performing a read operation.

According to some embodiments, the memory system 10 may perform a fourth compensation on the read data signal based on the first delay clock signal (S850).

According to some embodiments, the read data signal DQ_N received from the memory system 10 may be compensated by being combined with the second delay clock signal $2^{nd}$ Delay CLK. For example, the read data signal DQ_N received from the memory system 10 may be received by the buffer chip 100 through the receiving terminal RX, and may be combined with the second delay clock signal $2^{nd}$ Delay CLK. According to some embodiments, the read data signal DQ_N received from the memory system 10 may be combined with the second delay clock signal $2^{nd}$ Delay CLK to generate the serialized data signal DQ_C, and may be deserialized into the first data signal DQ1 and the second data signal DQ2. According to some embodiments, the first data signal DQ1 and the second data signal DQ2 may be re-serialized. According to some embodiments, when the first data signal DQ1 and the second data signal DQ2 each have a frequency of about 2.4 GHz, the first data signal DQ1 and the second data signal DQ2 may be serialized so that the data signal DQ has a frequency of about 4.8 GHz.

Figure 10:
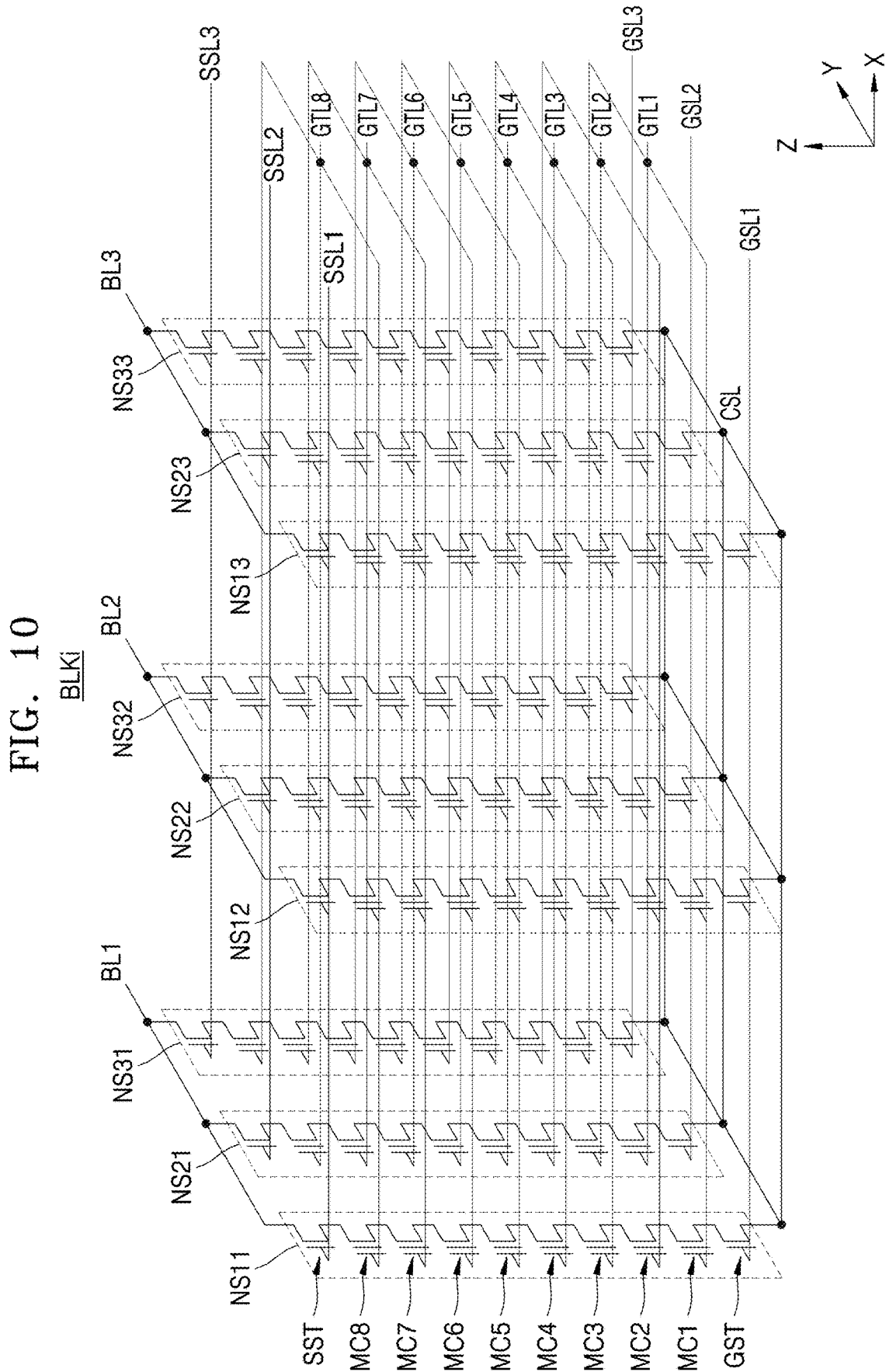
FIGS. 10 to 12 are diagrams illustrating a three-dimensional (3D) V-NAND structure that is applicable to a memory device according to some embodiments.
Figure 11:
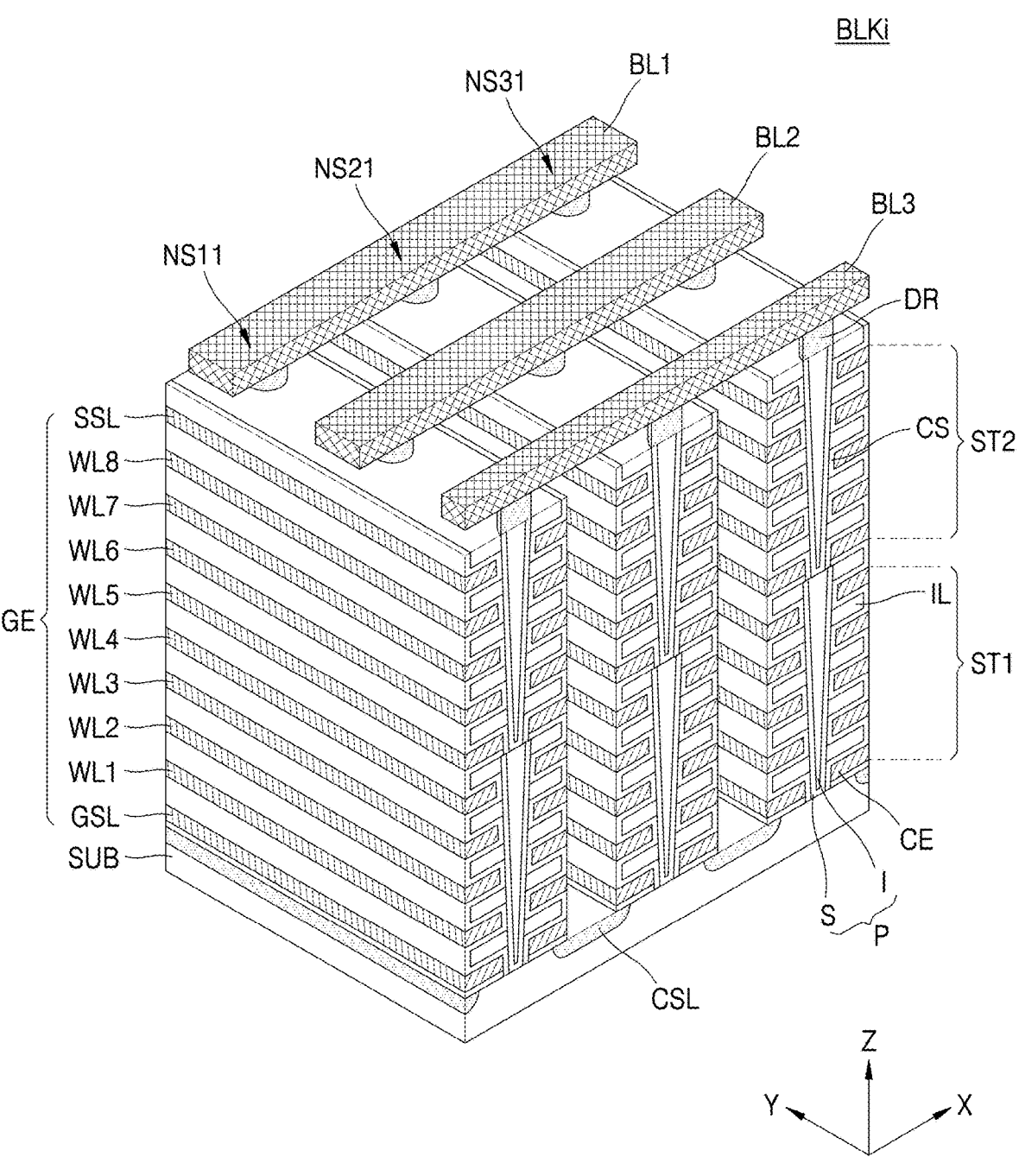
Figure 12:
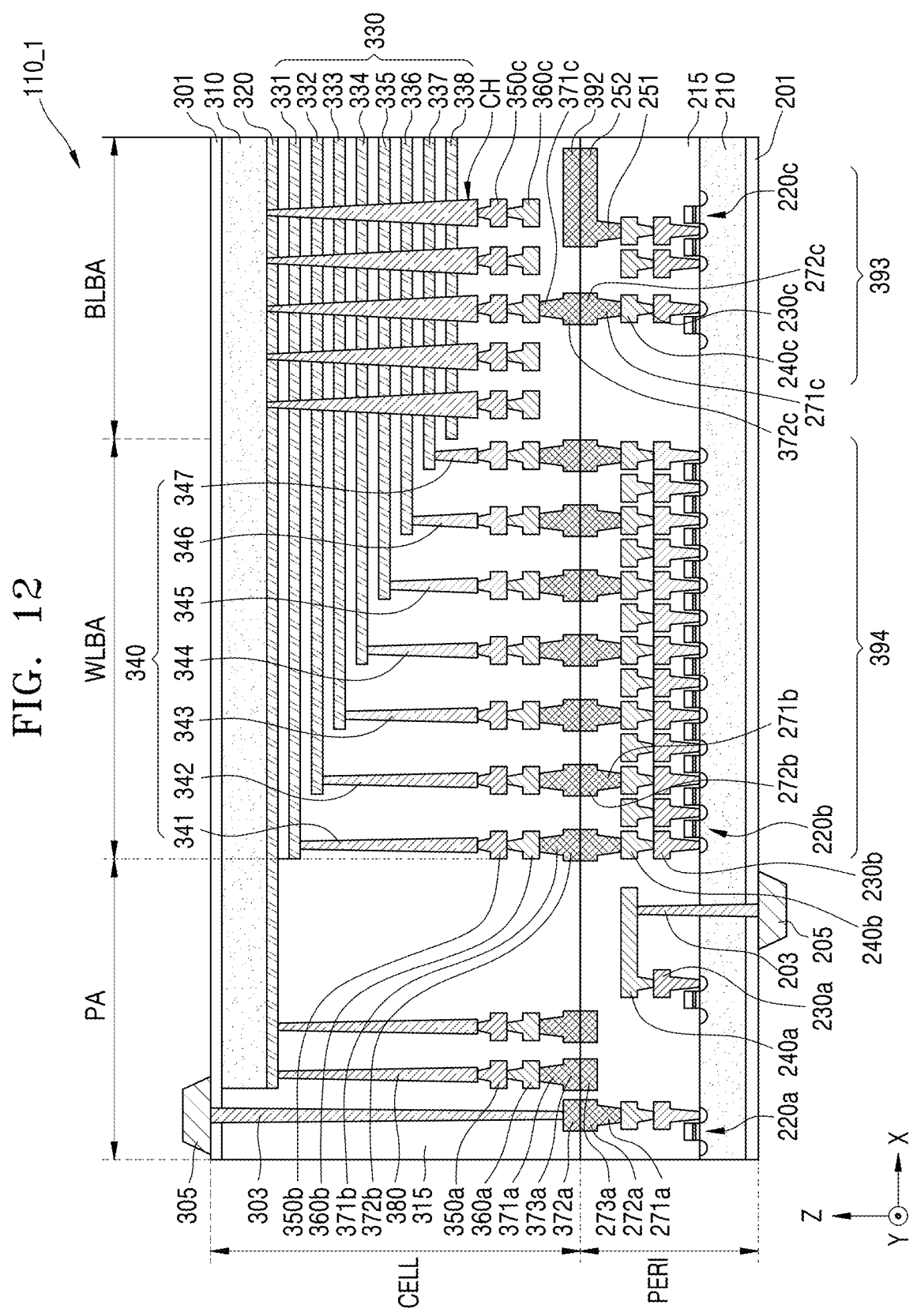

FIGS. 10 to 12 are diagrams illustrating a three-dimensional (3D) V-NAND structure that is applicable to the memory device 300 according to some embodiments.

A non-volatile memory applicable to the memory device 300 (see FIG. 1) may include a plurality of memory blocks. FIGS. 10 and 11 illustrate the structure of one memory block BLKi among the plurality of memory blocks, and FIG. 12 illustrates the non-volatile memory according to some embodiments.

Referring to FIG. 10, the memory block BLKi may include a plurality of memory NAND strings NS11 to NS33 connected between bit lines BL1, BL2, and BL3 and a common source line CSL. Each of the plurality of memory NAND strings NS11 to NS33 may include a string selection transistor SST, a plurality of memory cells MC1 to MC8, and a ground selection transistor GST. For case of illustration, FIG. 10 illustrates that each of the plurality of memory NAND strings NS11 to NS33 includes eight memory cells MC1 to MC8, but the inventive concepts are not necessarily limited thereto.

The string selection transistor SST may be connected to corresponding string selection lines SSL1, SSL2, and SSL3. The plurality of memory cells MC1 to MC8 may be connected to corresponding gate lines GTL1 to GTL8, respectively. The gate lines GTL1 to GTL8 may correspond to word lines, and some of the gate lines GTL1 to GTL8 may correspond to dummy word lines. The ground selection transistor GST may be connected to corresponding ground selection lines GSL1, GSL2, and GSL3. The string selection transistor SST may be connected to the corresponding bit lines BL1, BL2, and BL3, and the ground selection transistor GST may be connected to the common source line CSL.

Gate lines (e.g., GTL1) of the same height may be connected in common, and the ground selection lines GSL1, GSL2, and GSL3 and the string selection lines SSL1, SSL2, and SSL3 may be separated from each other. Although FIG. 10 illustrates that the memory block BLKi is connected to eight gate lines GTL1 to GTL8 and three bit lines BL1, BL2, and BL3, the inventive concepts are not necessarily limited thereto.

Referring to FIGS. 10 and 11, the memory block BLKi is formed in a direction perpendicular to a substrate SUB (e.g., Z direction). Memory cells constituting the memory NAND strings NS11 to NS33 are formed to be stacked on a plurality of semiconductor layers.

The common source line CSL extending in a first direction (Y direction) is provided on the substrate SUB. A plurality of insulating layers IL extending in the first direction (Y direction) may be sequentially provided on the substrate SUB in a third direction (Z direction), between two adjacent common source lines CSL, and the plurality of insulating layers IL may be spaced apart from each other by a certain distance in the third direction (Z direction). A plurality of pillars P may be provided on the substrate SUB between two adjacent common source lines CSL to be sequentially arranged in the first direction (Y direction) and to penetrate (i.e., extend into) the plurality of insulating layers IL in the third direction (Z direction). The plurality of pillars P may penetrate the plurality of insulating layers IL to be in contact with the substrate SUB. A surface layer S of each pillar P may include a silicon material doped with a first conductivity type dopant, and may function as a channel region.

An inner layer I of each pillar P may include an insulating material, such as silicon oxide, or an air gap. A charge storage layer CS may be provided between two adjacent common source lines CSL along the insulating layers IL, the pillars P, and an exposed surface of the substrate SUB. The charge storage layer CS may include a gate insulating layer (also referred to as a "tunneling insulating layer"), a charge trapping layer, and a blocking insulating layer. Also, a gate electrode GE, such as selection lines GSL and SSL and word lines WL1 to WL8, may be provided on an exposed surface of the charge storage layer CS between two adjacent common source lines CSL. Drains or drain contacts DR may be provided on the plurality of pillars P, respectively. The bit lines BL1 to BL3 extending in a second direction (X direction) and arranged spaced apart from each other by a certain distance in the first direction (Y direction) may be provided on the drains or drain contacts DR.

As illustrated in FIG. 11, each of the memory NAND strings NS11 to NS33 may be implemented in a structure in which a first memory stack ST1 and a second memory stack ST2 are stacked. The first memory stack ST1 may be connected to the common source line CSL, the second memory stack ST2 may be connected to the bit lines BL1 to BL3, and the first memory stack ST1 and the second memory stack ST2 may be stacked to share channel holes with each other.

Referring to FIG. 12, the non-volatile memory 110_1 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then connecting the upper chip and the lower chip to each other by a bonding method. For example, the bonding method may refer to a method of electrically connecting a bonding metal formed on an uppermost metal layer of the upper chip to a bonding metal formed on an uppermost metal layer of the lower chip. For example, when the bonding metals are formed of copper (Cu), the bonding method may be a Cu-to-Cu bonding. The bonding metals may also be formed of aluminum (Al) or tungsten (W).

Each of the peripheral circuit region PERI and the cell region CELL of the non-volatile memory may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c, respectively. In some embodiments, the first metal layers 230a, 230b, and 230c may be formed of tungsten having relatively high electrical resistivity, and the second metal layers 240a, 240b, and 240c may be formed of copper having relatively low electrical resistivity.

Although only the first metal layers 230a, 230b, and 230c and the second metal layers 240a, 240b, and 240c are illustrated and described herein, the inventive concepts are not limited thereto, and one or more metal layers may be additionally formed on the second metal layers 240a, 240b, and 240c. At least a portion of the one or more metal layers formed on the second metal layers 240a, 240b, and 240c may be formed of aluminum or the like having a lower electrical resistivity than copper forming the second metal layers 240a, 240b, and 240c.

The interlayer insulating layer 215 may be arranged on the first substrate 210 to cover the plurality of circuit elements 220a, 220b, and 220c, the first metal layers 230a, 230b, and 230c, and the second metal layers 240a, 240b, and 240c, and may include an insulating material, such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to upper bonding metals 371b and 372b of the cell region CELL by a bonding method, and the lower bonding metals 271b and 272b and the upper bonding metals 371b and 372b may be formed of aluminum, copper, tungsten, or the like.

The cell region CELL may provide at least one memory block. The cell region CELL may include a second substrate 310 and a common source line 320. On the second substrate 310, a plurality of word lines 331 to 338 (i.e., 330) may be stacked in a direction (Z-axis direction) perpendicular to an upper surface of the second substrate 310. String select lines and ground select lines may be arranged on and below the word lines 330, respectively, and the plurality of word lines 330 may be arranged between the string select lines and the ground select lines.

In the bit line bonding area BLBA, a channel structure CH may extend in a direction (Z-axis direction) perpendicular to the upper surface of the second substrate 310 to pass through the word lines 330, the string select lines, and the ground select lines. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In some embodiments, the bit line may extend in a first direction (Y-axis direction) parallel to the upper surface of the second substrate 310.

An area in which the channel structure CH, the bit line 360c, and the like are arranged may be defined as the bit line bonding area BLBA. In the bit line bonding area BLBA, the bit line 360c may be electrically connected to the circuit elements 220c providing a page buffer 393 in the peripheral circuit region PERI. For example, the bit line 360c may be connected to upper bonding metals 371c and 372c in the cell region CELL, and the upper bonding metals 371c and 372c may be connected to lower bonding metals 271c and 272c in the peripheral circuit region PERI that are connected to the circuit elements 220c of the page buffer 393.

In the word line bonding area WLBA, the word lines 330 may extend in a second direction (X-axis direction) parallel to the upper surface of the second substrate 310 and perpendicular to the first direction (Y-axis direction), and may be connected to a plurality of cell contact plugs 341 to 347 (i.e., 340). The word lines 330 and the cell contact plugs 340 may be connected to each other in pads provided by at least a portion of the word lines 330 extending in different lengths in the second direction (X-axis direction). A first metal layer 350b and a second metal layer 360b may be sequentially connected to an upper portion of the cell contact plugs 340 connected to the word lines 330. The cell contact plugs 340 may be connected to the peripheral circuit region PERI through the upper bonding metals 371b and 372b of the cell region CELL and the lower bonding metals 271*b* and 272*b* of the peripheral circuit region PERI in the word line bonding area WLBA. It will be understood that upper and lower portions of an element in the cell region CELL as described herein may refer to upper and lower portions of the element in a negative Z-axis direction.

The cell contact plugs 340 may be electrically connected to the circuit elements 220*b* providing a row decoder 394 in the peripheral circuit region PERI. In some embodiments, operating voltages of the circuit elements 220*b* forming the row decoder 394 may be different from operating voltages of the circuit elements 220*c* forming the page buffer 393. For example, the operating voltages of the circuit elements 220*c* forming the page buffer 393 may be greater than the operating voltages of the circuit elements 220*b* forming the row decoder 394.

A common source line contact plug 380 may be arranged in the external pad bonding area PA. The common source line contact plug 380 may be formed of a conductive material, such as a metal, a metal compound, polysilicon, or the like, and may be electrically connected to the common source line 320. A first metal layer 350*a* and a second metal layer 360*a* may be sequentially stacked on an upper portion of the common source line contact plug 380. For example, an area in which the common source line contact plug 380, the first metal layer 350*a*, and the second metal layer 360*a* are arranged may be defined as the external pad bonding area PA.

First and second input-output pads 205 and 305 may be arranged in the external pad bonding area PA. A lower insulating layer 201 covering a lower surface of the first substrate 210 may be formed below the first substrate 210, and the first input-output pad 205 may be formed on the lower insulating layer 201. The first input-output pad 205 may be connected to at least one of the plurality of circuit elements 220*a*, 220*b*, and 220*c* arranged in the peripheral circuit region PERI through a first input-output contact plug 203, and may be separated from the first substrate 210 by the lower insulating layer 201. Also, a side insulating layer may be arranged between the first input-output contact plug 203 and the first substrate 210 to electrically separate the first input-output contact plug 203 and the first substrate 210.

An upper insulating layer 301 covering the upper surface of the second substrate 310 may be formed on the second substrate 310, and the second input-output pad 305 may be arranged on the upper insulating layer 301. The second input-output pad 305 may be connected to at least one of the plurality of circuit elements 220*a*, 220*b*, and 220*c* arranged in the peripheral circuit region PERI through a second input-output contact plug 303. In some embodiments, the second input-output pad 305 may be electrically connected to the circuit element 220*a*.

According to some embodiments, the second substrate 310 and the common source line 320 may not be arranged in an area in which the second input-output contact plug 303 is arranged. Also, the second input-output pad 305 may not overlap the word lines 330 in the third direction (Z-axis direction). The second input-output contact plug 303 may be separated from the second substrate 310 in a direction parallel to the upper surface of the second substrate 310, and may pass through the interlayer insulating layer 315 of the cell region CELL to be connected to the second input-output pad 305.

According to some embodiments, the first input-output pad 205 and the second input-output pad 305 may be selectively formed. For example, the non-volatile memory may include only the first input-output pad 205 arranged on the first substrate 210, or may include only the second input-output pad 305 arranged on the second substrate 310. In some embodiments, the non-volatile memory may include both the first input-output pad 205 and the second input-output pad 305.

In each of the external pad bonding area PA and the bit line bonding area BLBA respectively included in the cell region CELL and the peripheral circuit region PERI, a metal pattern of an uppermost metal layer may be present as a dummy pattern or the uppermost metal layer may be empty.

In the external pad bonding area PA of the non-volatile memory, in correspondence to an upper metal pattern 373*a* formed in an uppermost metal layer of the cell region CELL, a lower metal pattern 273*a* having the same shape as the upper metal pattern 373*a* may be formed in an uppermost metal layer of the peripheral circuit region PERI. The lower metal pattern 273*a* formed in the uppermost metal layer of the peripheral circuit region PERI may not be connected to a separate contact in the peripheral circuit region PERI. Similarly, in the external pad bonding area PA, in correspondence to a lower metal pattern 272*a* formed in the uppermost metal layer of the peripheral circuit region PERI, an upper metal pattern 372*a* having the same shape as the lower metal pattern 272*a* of the peripheral circuit region PERI may be formed in an upper metal layer of the cell region CELL.

The lower bonding metals 271*b* and 272*b* may be formed on the second metal layer 240*b* in the word line bonding area WLBA. In the word line bonding area WLBA, the lower bonding metals 271*b* and 272*b* of the peripheral circuit region PERI may be electrically connected to the upper bonding metals 371*b* and 372*b* of the cell region CELL by a bonding method.

Also, in the bit line bonding area BLBA, in correspondence to a lower metal pattern 252 formed in the uppermost metal layer of the peripheral circuit region PERI, an upper metal pattern 392 having the same shape as the lower metal pattern 252 of the peripheral circuit region PERI may be formed in the uppermost metal layer of the cell region CELL. A contact may not be formed on the upper metal pattern 392 formed in the uppermost metal layer of the cell region CELL.

As used herein, the terms "comprises", "comprising", "includes", "including", "has", "having" and any other variations thereof specify the presence of the stated features, steps, operations, elements, components, and/or groups but do not preclude the presence or addition of one or more other features, steps, operations, elements, components, and/or groups thereof.

While the inventive concepts have been particularly shown and described with reference to embodiments thereof, it will be understood that various changes in form and details may be made therein without departing from the scope of the following claims.

What is claimed is:

1. A memory system comprising:
a memory device comprising a plurality of non-volatile memories, each of the plurality of non-volatile memories being electrically connected to a buffer chip; and
a memory controller electrically connected to the buffer chip and configured to transmit a reference clock signal used in correction of a data signal,
wherein the buffer chip comprises:
a delay clock generation chain configured to generate at least one of a first delay clock signal or a second delay clock signal from the reference clock signal;

a first register configured to store a first delay clock code comprising information of the first delay clock signal; and a second register configured to store a second delay clock code comprising information of the second delay clock signal, and wherein the buffer chip is configured to perform a coarse locking operation on a data strobe signal based on the first delay clock code, perform a fine locking operation on the data strobe signal based on the second delay clock code, perform compensation on the data strobe signal based on a delay division generated based on the coarse locking operation and the fine locking operation, and perform compensation on the data signal based on the second delay clock signal.

2. The memory system of claim 1, wherein, when a write operation is performed, the buffer chip is configured to perform compensation on the data strobe signal based on the first delay clock code by phase-shifting the first delay clock signal by 90°, and combining the first delay clock signal that is phase-shifted by 90° with the data strobe signal.

3. The memory system of claim 1, wherein, when a write operation is performed, the buffer chip is further configured to perform compensation on the data strobe signal by combining the second delay clock signal with the data strobe signal.

4. The memory system of claim 1, further comprising:

a time-to-digital converter (TDC) configured to perform time-to-digital conversion on the reference clock signal; and a third register configured to store information of the reference clock signal that is time-to-digital converted.

5. The memory system of claim 4, wherein, when a write operation is performed, the buffer chip is further configured to perform compensation on the data signal by combining the reference clock signal that is time-to-digital converted with the data signal.

6. The memory system of claim 1, wherein, when a write operation is performed, the buffer chip is configured to perform compensation on the data signal based on the second delay clock signal by combining the second delay clock signal with the data signal.

7. The memory system of claim 1, wherein, when a read operation is performed, the buffer chip is further configured to:

perform a coarse locking operation on the data strobe signal based on the first delay clock code;

perform a fine locking operation on the data strobe signal based on the second delay clock code; and perform compensation on a second read signal for the data signal based on the second delay clock signal.

8. An operating method of a memory system comprising a memory device and a memory controller, the memory device comprising a plurality of non-volatile memories, each of the plurality of non-volatile memories being electrically connected to a buffer chip, and the memory controller being electrically connected to the buffer chip and configured to transmit a reference clock signal used in compensation of a data signal, the operating method comprising:

generating at least one of a first delay clock signal or a second delay clock signal from the reference clock signal;

storing a first delay clock code comprising information of the first delay clock signal;

storing a second delay clock code comprising information of the second delay clock signal; and compensating for the data signal based on a first delay clock code and a second delay clock code, wherein the compensating for the data signal comprises performing a coarse locking operation on a data strobe signal based on the first delay clock code, performing a fine locking operation on the data strobe signal based on the second delay clock code, performing compensation on the data strobe signal based on a delay division generated based on the coarse locking operation and the fine locking operation, and performing compensation on the data signal based on the second delay clock signal.

9. The operating method of claim 8, wherein, when a write operation is performed, the performing compensation on the data strobe signal comprises phase-shifting the first delay clock signal by 90°, and combining the first delay clock signal that is phase-shifted by 90° with the data strobe signal.

10. The operating method of claim 8, wherein, when a write operation is performed, the compensating for the data signal further comprises performing compensation on the data strobe signal by combining the second delay clock signal with the data strobe signal.

11. The operating method of claim 8, further comprising:

performing time-to-digital (TDC) conversion on the reference clock signal; and storing information of the reference clock signal that is time-to-digital converted.

12. The operating method of claim 11, wherein, when a write operation is performed, the compensating for the data signal further comprises performing compensation on the data signal by combining the reference clock signal that is time-to-digital converted with the data signal.

13. The operating method of claim 8, wherein, when a write operation is performed, the performing compensation on the data signal based on the second delay clock signal comprises combining the second delay clock signal with the data signal.

14. The operating method of claim 9, wherein, when a read operation is performed, the compensating for the data signal further comprises:

performing a coarse locking operation on the data strobe signal based on the first delay clock code;

performing a fine locking operation on the data strobe signal based on the second delay clock code; and performing compensation on a second read signal for the data signal based on the second delay clock signal.

15. An interface circuit of a memory system, the interface circuit comprising:

a delay clock generation chain configured to generate at least one of a first delay clock signal or a second delay clock signal from a reference clock signal;

a first register configured to store a first delay clock code comprising information of the first delay clock signal; and a second register configured to store a second delay clock code comprising information of the second delay clock signal, wherein the interface circuit is configured to perform a coarse locking operation on a data strobe signal based on a first delay clock code, perform a fine locking operation on the data strobe signal based on a second delay clock code, perform compensation on the data strobe signal based on a delay division generated based on the coarse locking operation and the fine locking operation, and perform compensation on the data signal based on the second delay clock signal.

16. The interface circuit of claim 15, wherein, when a write operation is performed, the interface circuit is further configured to perform compensation on the data strobe signal based on the first delay clock code by phase-shifting the first delay clock signal by 90°, and combining the first delay clock signal that is phase-shifted by 90° with the data strobe signal.

17. The interface circuit of claim 15, wherein, when a write operation is performed, the interface circuit is further configured to perform compensation on the data strobe signal by combining the second delay clock signal with the data strobe signal.

18. The interface circuit of claim 15, further comprising:

a time-to-digital converter (TDC) configured to perform time-to-digital conversion on the reference clock signal; and a third register configured to store information of the reference clock signal that is time-to-digital converted.

19. The interface circuit of claim 15, wherein, when a write operation is performed, the interface circuit is further configured to perform compensation on the data signal based on the second delay clock signal by combining the second delay clock signal with the data signal.

20. The interface circuit of claim 15, wherein, when a read operation is performed, the interface circuit is further configured to:

perform a coarse locking operation on the data strobe signal based on the first delay clock code;

perform a fine locking operation on the data strobe signal based on the second delay clock code; and perform compensation on a second read signal for the data signal based on the second delay clock signal.

* * * * *